US 7,848,840 B2

(12) United States Patent
Dao et al.

(10) Patent No.: US 7,848,840 B2
(45) Date of Patent: Dec. 7, 2010

(54) METHOD OF CONTROLLING PROCESS PARAMETERS FOR SEMICONDUCTOR MANUFACTURING APPARATUS

(75) Inventors: Ritchie Dao, San Jose, CA (US); Derek Brodie, Sunnyvale, CA (US); Scott Olszewski, Sunnyvale, CA (US); Duy D Nguyen, Milpitas, CA (US); Chunlei Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 236 days.

(21) Appl. No.: 12/052,024

(22) Filed: Mar. 20, 2008

(65) Prior Publication Data

US 2009/0177310 A1 Jul. 9, 2009

Related U.S. Application Data

(60) Provisional application No. 61/019,188, filed on Jan. 4, 2008.

(51) Int. Cl.
*G06F 19/00* (2006.01)
*G05B 13/00* (2006.01)
*G05B 11/42* (2006.01)
*G05D 23/00* (2006.01)

(52) U.S. Cl. .................... 700/121; 700/37; 700/42; 700/120; 700/300; 219/121.58

(58) Field of Classification Search .................. 700/42, 700/121, 300, 37, 120; 219/497; 701/42
See application file for complete search history.

(56) References Cited

U.S. PATENT DOCUMENTS 6,259,072 B1* 7/2001 Kinnard et al. ............. 219/486

| 6,347,636 | B1* | 2/2002 | Xia et al. ............... 134/1.1 |
|---|---|---|---|
| 7,188,001 | B2* | 3/2007 | Young et al. ............... 700/266 |
| 7,415,312 | B2* | 8/2008 | Barnett et al. ............... 700/29 |
| 7,557,328 | B2* | 7/2009 | Ohata ............... 219/497 |
| 2004/0098145 | A1* | 5/2004 | Zhenduo et al. ............... 700/42 |
| 2005/0029250 | A1* | 2/2005 | Niwa et al. ............... 219/494 |
| 2006/0196653 | A1* | 9/2006 | Elsdoerfer et al. ............... 165/206 |
| 2008/0255683 | A1* | 10/2008 | Takahashi et al. ............... 700/42 |

OTHER PUBLICATIONS

Oakleef Engineering, "BeyondPID Controller", 1999, pp. 1-23.*
Oakleef Engineering, "Multizone Control Challenges and Solutions", 1999, pp. 1-4.*

* cited by examiner

*Primary Examiner*—Albert DeCady
*Assistant Examiner*—Olvin Lopez
(74) *Attorney, Agent, or Firm*—Blakely, Sokoloff, Taylor & Zafman (57) ABSTRACT

Methods and systems for adaptively controlling process parameters in semiconductor manufacturing equipment. An embodiment provides for gain scheduling of PID controllers across recipe steps. One embodiment provides a method for controlling a chuck temperature during a semiconductor manufacturing process, the method employing a first set of proportional-integral-derivative (PID) values in a PID controller to control the chuck temperature at a first setpoint in a first step of a process recipe and employing a second set of PID values in the PID controller to control the chuck temperature at a second setpoint, different than the first setpoint, in a second step of the process recipe. The methods and systems provide reduced controller response times where process parameter setpoint between steps of a process recipe span a wide range.

17 Claims, 6 Drawing Sheets

METHOD OF CONTROLLING PROCESS PARAMETERS FOR SEMICONDUCTOR MANUFACTURING APPARATUS

CROSS REFERENCE TO RELATED APPLICATIONS

This application claims the benefit of U.S. Provisional Application No. 61/019,188, filed Jan. 4, 2008, the entire contents of which are hereby incorporated by reference herein.

BACKGROUND

1) Field

Embodiments of the present invention generally relate to microelectronic fabrication, and more particularly to methods of controlling a process parameter in a process recipe performed by a semiconductor manufacturing apparatus.

2) Description of Related Art

Today, the majority of semiconductor fabrication processes are performed with single-substrate manufacturing equipment. Improved process uniformity and control has generally outweighed the throughput reduction associated with such serial processing as compared to parallel processing of batch equipment. With the continuing reduction in the dimensions and film thicknesses formed in a given manufacturing process, the duration of each particular value-added step, such as an etch or deposition, in a fabrication process has steadily become shorter. However, each value-added step typically requires a certain amount of non-value-added process time overhead including such things as substrate handling and stability steps. To reduce handling overhead, many process recipes now combine a number of value-added process steps in sequence. However, such in-situ recipes still typically require a stability step of a finite duration to allow the manufacturing process parameters to be switched from a setpoint used in a first value-added operation to another parameter setpoint for a subsequent value-added operation. Depending on the duration of each stability step, the cumulative overhead for a given process may become a significant fraction of the total process time for a substrate or workpiece in a single-substrate manufacturing tool.

Figure 1:
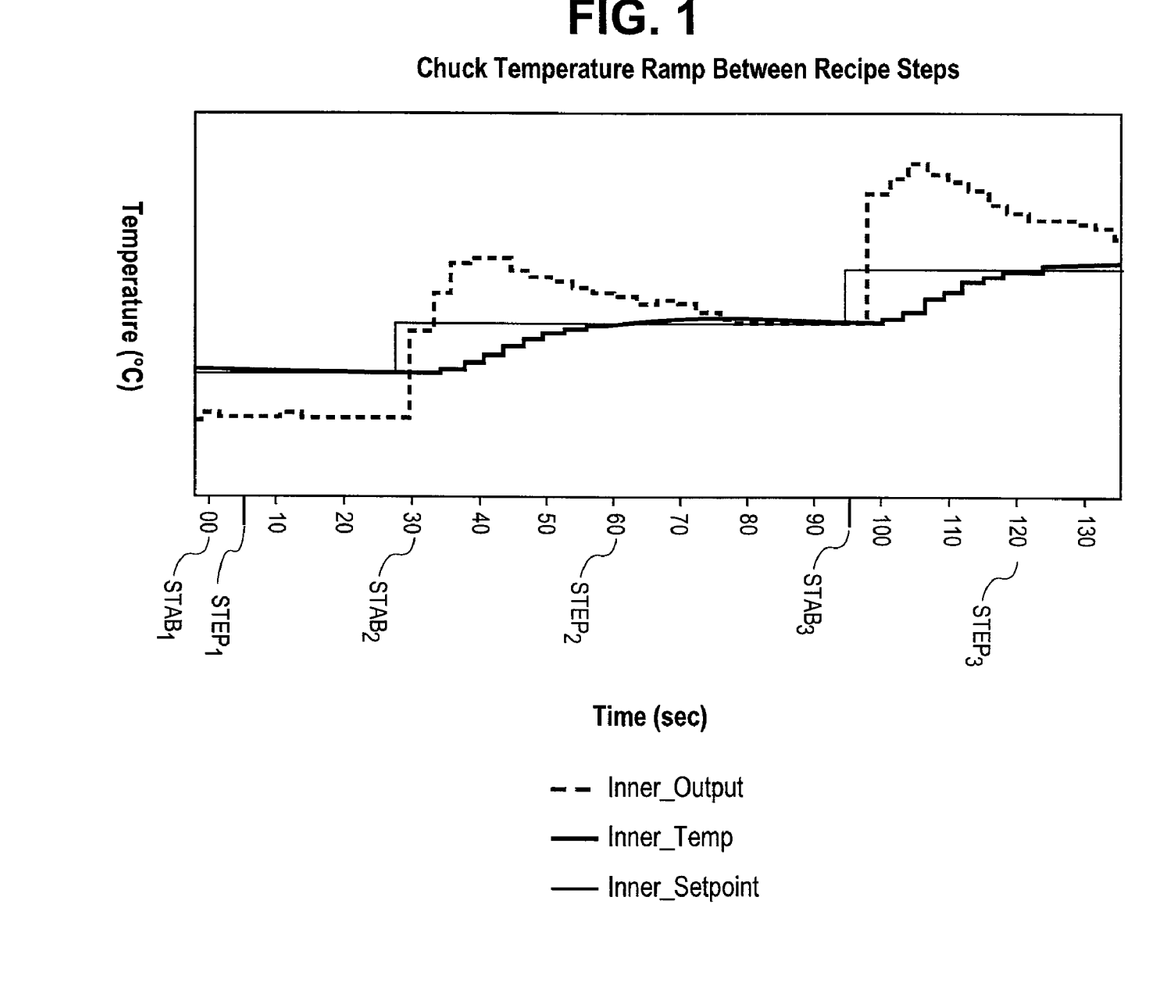
FIG. 1 is a graph depicting a chuck temperature process parameter spanning a range of setpoints across a number of stabilization and process steps of a manufacturing process recipe executed by a conventionally controlled chuck of a semiconductor manufacturing apparatus.

For example, FIG. 1 depicts a typical process parameter response during a fabrication process recipe sequence. In this example, the process parameter is the process temperature of a substrate holder, commonly called a chuck. The chuck temperature is controlled to heat the substrate to various controlled temperatures during the process recipe. As shown, the recipe begins with a first stability step, "Stab$_1$" at time "00" on the x-axis at which time the actual chuck temperature, "Inner_Temp," is approximately 32° C. as controlled to the chuck temperature setpoint, "Inner_Setpoint." The duration of "Stab$_1$" is a relatively short 8 seconds, after which the value-added "Step$_1$" is performed until a total process recipe time of 30 seconds has elapsed. "Stab$_1$" only needs to be a few seconds to stabilize process controllers having short response times, such as mass flow controllers (MFC). At time "30" on the x-axis, "Stab$_2$" begins, during which the "Inner_Temp" is controlled to a second "Inner_Setpoint" temperature of 45° C. As depicted in the graph, the actual chuck temperature requires approximately 30 seconds to heat from the 32° C. setpoint of Step$_1$ to the 45° C. required in the second value-added step, "Step$_2$." Then, "Step$_2$" is performed for approximately 35 seconds, until another 25 second stability step, "Stab$_3$," is required to reach a 52° C. chuck temperature. Following "Stab$_3$," the value-added step "Step$_3$" is performed for 15 seconds. Conventionally, a linear controller, such as a PID controller is employed for each of the "Inner_Setpoint" values required by a particular recipe.

As evident from the graph in FIG. 1, the cumulative non-value added stability time represents a significant amount of overhead to the total process recipe time. In this specific example, this non-value-added time accounts for approximately 47%, or about half, of the total process time. The overhead incurred will likely become a greater fraction as value-added step duration continues to decrease with device scaling.

Similarly, the fraction of non-value-added time will also increase as recipes with a greater number of steps requiring process parameter setpoints spanning a wide setpoint range are performed in-situ (within a single manufacturing apparatus) rather than in separately tuned systems. As the setpoint range gets wider, non-linearity in the system renders the conventional linear PID control algorithm inadequate and the response time for the extremes in the setpoint range become intolerable.

An adaptive control architecture would advantageously reduce the process overhead.

SUMMARY

Methods and systems for adaptively controlling process parameters within a process recipe executed by semiconductor manufacturing equipment are described herein. In a certain embodiment, methods and systems employing gain scheduling for PID loop tuning across steps of a process recipe may advantageously provide reduced response times where the size of the change in a process parameter setpoint between steps of a process recipe spans a wide range. Reductions in response times may enable a process recipe to have shorter stabilization times and so the methods and systems described herein are well suited for reducing the overhead associated with stabilization steps typically found between value-added manufacturing steps in a process recipe.

One embodiment provides a method where a first set of proportional-integral-derivative (PID) values is employed in a PID controller to control the process parameter at a first setpoint in a first step of a process recipe and a second set of PID values is employed in the PID controller to control the process parameter at a second setpoint, different than the first setpoint, in a second step of the process recipe, wherein at least one of the PID values in the second set is different than those of the first set. The PID values for the first and second steps may be determined from a database of empirically determined values or determined by an algorithm to tune the loop at each recipe step. The determined PID values may then be provided to a PID controller by a process module controller executing the process recipe.

In a further embodiment, only the proportional gain value of the second set of PID values is different than that of the first set of PID values, with the integral and derivative values remaining constant. In one such embodiment, the proportional gain value decreases as a function of the first setpoint but increases as a function of the delta between the first and second setpoints to improve the control response across a wide range of setpoint deltas between recipe steps.

The process parameters controlled by the methods and systems described herein may be any of a number of parameters controlled by a semiconductor manufacturing apparatus during the fabrication of a semiconductor device that has a non-negligible response time. Examples include process chamber wall temperatures, CMP pad or holder temperatures, and chamber pressures. In a particular implementation, the process parameter comprises a temperature of a chuck in a chamber configured to subject a substrate or workpiece positioned on the chuck to a manufacturing process, such as, but not limited to, etching, depositing, ion implanting, or chemical mechanical polishing. While chuck temperature is frequently referred to herein as an exemplary embodiment of a process parameter because it has a relatively slow response time, similar methods may be readily applied to other process parameters by one of ordinary skill in the art.

An embodiment provides a method for controlling a temperature of one or more zones of a chuck during a semiconductor manufacturing process, the method employing a first set of proportional-integral-derivative (PID) values in a PID controller to control the chuck temperature at a first setpoint in a first step of a process recipe and employing a second set of PID values in the PID controller to control the chuck temperature at a second setpoint, different than the first setpoint, in a second step of the process recipe. In one embodiment, the second set of PID values is determined as a function of the first setpoint and as a function of a delta between the first setpoint of the first recipe step and the second setpoint of the second recipe step. In a further embodiment, the second set of PID values is dependent on whether a temperature delta between the first and second setpoint is greater than a temperature delta threshold. In one such embodiment, the temperature delta threshold is between about 10° C. and about 15° C.

In one such implementation, controlling the chuck temperature at the second setpoint further comprises: cooling the chuck with a coolant, the coolant provided at a temperature setpoint controlled by a heat exchanger; and heating the chuck with a first resistive heating element to the second setpoint, higher than the coolant temperature, wherein the power input to the first heating element is controlled by the PID controller using the second set of PID values. In a further embodiment, the second set of PID values is further determined as a function of the coolant temperature setpoint of the heat exchanger.

One embodiment provides the set of PID values employed by the PID controller at each step is selected from a PID database comprising PID values predetermined for given input conditions. In one implementation, the PID values in the PID database are predetermined by a method wherein a set of first chuck temperature setpoints are defined, a set of second chuck setpoints are defined, a set of coolant temperature setpoints are defined and an auto-learn function of the PID controller is then executed at least once for each a plurality of the defined first chuck temperature setpoints, second chuck setpoints and coolant temperature setpoints (the first and second temperature setpoints defining a temperature setpoint delta). If desired, the auto-learn results may then be further fine tuned manually to find the best performing PID set points for each scenario.

Another embodiment provides a computer readable media with instructions stored thereon, which when executed by a processing system, cause the system to perform a method including loading a process recipe into a memory, determining from the process recipe a first chuck temperature setpoint of a first recipe step, determining from the process recipe a second chuck temperature setpoint of a second recipe step, accessing a PID database containing PID values for particular process parameter inputs and determining a first set of PID values as a function of at least the first chuck temperature setpoint and a temperature delta between the first and second chuck temperature setpoint and executing the second process recipe step while controlling the chuck temperature with a PID controller employing the determined first set of PID values.

In a further embodiment, the instructions further provide for determining from the process recipe a third chuck temperature setpoint of a third recipe step, determining a second set of PID values, different than the first set of PID values and executing the third process recipe step while controlling the chuck temperature with a PID controller employing the determined second set of PID values.

Yet another embodiment provides a semiconductor manufacturing apparatus including: a process module with a controllable unit, such as a temperature controllable chuck; a process module controller for controlling the controllable unit; a process module recipe file defining a sequence of recipe steps to occur in the process module, wherein a process parameter setpoint, such as a temperature of a first zone of a chuck, is different between a first and second recipe step; a chiller and/or heat exchanger to provide coolant to the chuck, the chiller and/or heat exchanger communicatively coupled to the process module controller; a first resistive heater to heat the first zone of the chuck above the temperature of the coolant to the temperature set point of the first and second recipe steps; and a PID database to be accessed by the process module controller to determine a first set of PID values for controlling the first resistive heater during the first recipe step and to determine a second set of PID values for controlling the first resistive heater during the second recipe step.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth, such as temperature ranges and PID gain values, to provide a thorough understanding of the present invention. It will be apparent to one skilled in the art that the present invention may be practiced without these specific details. In other instances, well-known features, such as temperature controller PID value learning techniques, are not described in detail to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

Figure 2:
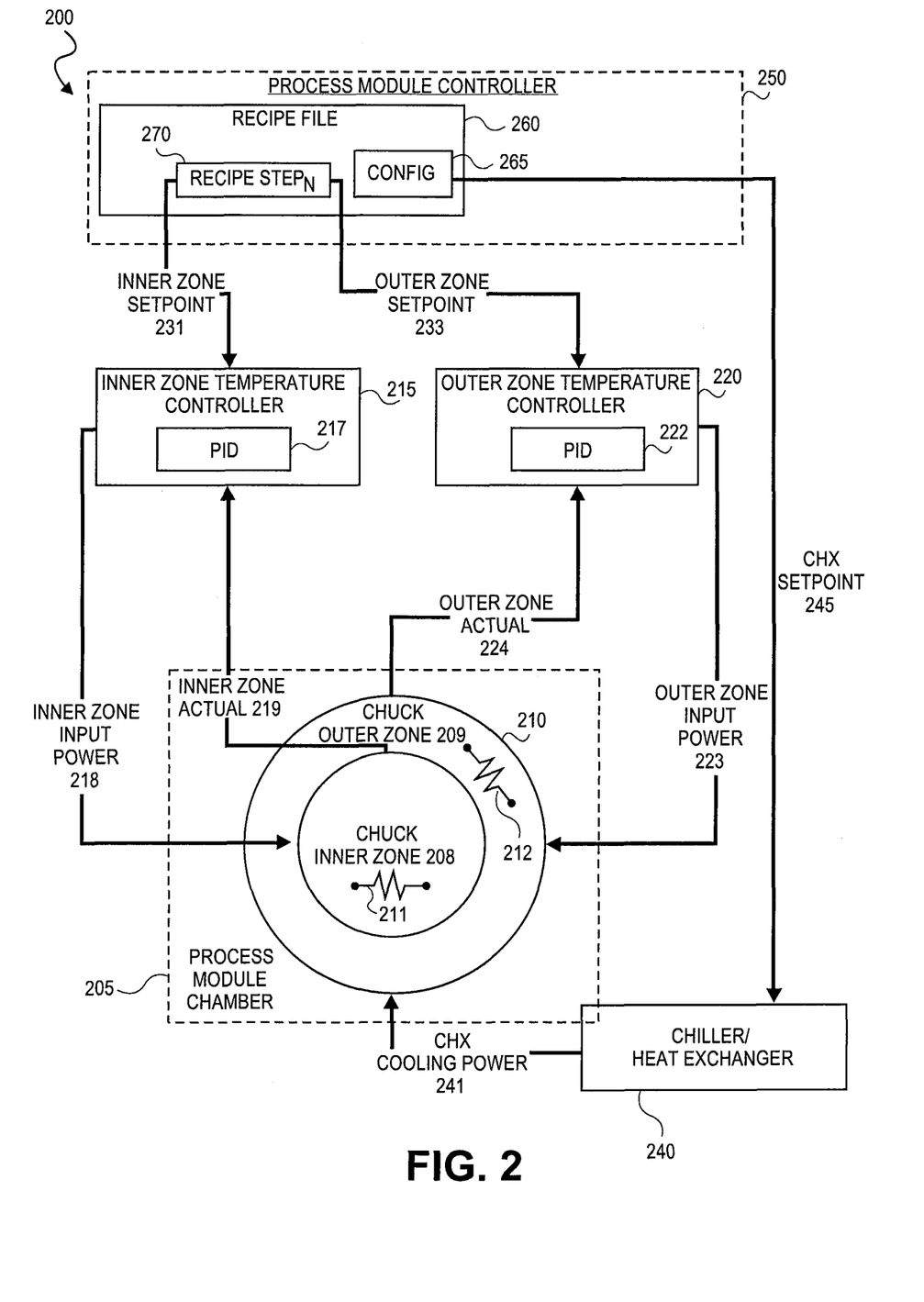
FIG. 2 illustrates a schematic of a semiconductor apparatus having a chuck with dual-zone temperature control capability to which an embodiment of the present invention may be applied.

FIG. 2 depicts a manufacturing apparatus 200 including a process module chamber 205 for processing a workpiece positioned on the chuck 210. In one implementation, the process module chamber 205 is an etch process module such as the DPS II AdvantEdge™ G3, available commercially from Applied Materials, Inc. of Calif., USA. Other etch process modules, as well as other process modules, such as deposition process modules, ion implantation stations, and chemical mechanical planarization (CMP) modules may be utilized in other embodiments. Chuck 210 may be any temperature controlled holder of the workpiece, such as a physically clamped chuck or vacuum clamped chuck. For the particular DPS II AdvantEdge™ G3 implementation, chuck 210 is an electrostatic chuck (ESC).

A chuck may be cooled by a chiller and/or heat exchanger (CHX), such as chiller and/or heat exchanger 240 depicted in FIG. 2. The chiller and/or heat exchanger 240 is operable to provide cooling power 241 to the chuck 210 via a coolant loop thermally coupled to the chuck 210. In a particular embodiment, the coolant loop passes through a channel embedded below the workpiece supporting surface of the chuck 210. The chiller and/or heat exchanger 240 typically includes a PID controller (not shown) to control the coolant to a CHX setpoint 245. The chiller and/or heat exchanger 240 may be operable over wide range of temperatures. In one embodiment, the chiller and/or heat exchanger 240 is capable of controlling the coolant to a temperature between approximately −15° C. to approximately 60° C.

A chuck may further include a plurality of independently controlled temperature zones. As depicted, the chuck 210 includes an inner and outer zone, 208 and 209 respectively. The inner zone 208 is thermally coupled to a resistive heater 211, to which an inner zone input power 218 is provided by an inner zone temperature controller 215. The outer zone 209 is thermally coupled to a resistive heater 212, to which an outer zone input power 223 is determined by an outer zone temperature controller 220. The resistive heaters in each zone may be operable over a wide temperature range. In one embodiment, the resistive heaters are configured to heat the chuck 210 to a temperature greater than that of the CHX setpoint 245, between approximately 0° C. and 100° C.

The chuck temperature may be controlled by proportional-integral-derivative (PID) controllers. The inner and outer zone temperature controllers, 215 and 220 of FIG. 2 each utilize a set of PID values 217 and 222, respectively. As used herein, a "set" of PID values includes a proportional gain term ($K_p$), an integral gain term ($K_i$) and a derivative gain term ($K_d$). The PID controllers may be of any type commonly available, such as, but not limited to one of those commercially available from Azbil of Yamatake Corp., Japan.

In operation, the CHX setpoint 245 is typically set to a temperature substantially below the desired process temperature of the chuck 210 and the inner zone temperature controller 215 employs PID values 217 in a control algorithm to control the inner zone input power 218 to the resistive heater 211, thereby controlling the inner zone actual temperature 219 to an inner zone temperature setpoint 231 greater than the temperature setpoint 245 of chiller and/or heat exchanger 240. Similarly, the outer zone temperature controller 220 employs PID values 222 in an algorithm to control the outer zone input power 223 to the resistive heater 212, thereby controlling the outer zone actual temperature 224 to an outer zone temperature setpoint 233 greater than the temperature setpoint 245 of chiller and/or heat exchanger 240.

As further depicted in FIG. 2, the inner zone temperature setpoint 231, outer zone temperature setpoint 233 and CHX setpoint 245 are determined by the process module controller 250 communicative coupled to the subsystems (temperature controllers, CHX, etc.). The process module controller 250 may be either software or hardware or a combination of both software and hardware configured to control the process parameters of the process module chamber 205. During operation, the process module controller 250 accesses and executes a recipe file 260. Associated with the recipe file 260 is a configuration file 265 defining a number of global process parameter values pertaining to the process module chamber 205. In the exemplary implementation depicted, the CHX setpoint 245 to be communicated to the chiller and/or heat exchanger 240 is defined in the configuration file 265. The recipe file 260 further defines the process parameter setpoints and step durations for a process recipe step 270. While the process module controller 250 is depicted as separate from subsystems, such as the inner and outer zone temperature controllers, 215 and 220, it should be appreciated the distinction is made herein merely for clarity of functionality and one of ordinary skill in the art would be able to implement the functionality of many of the subsystems within the process module controller 250 and visa versa.

The recipe file may include a number of recipe steps, including both stability steps and value-added process steps. With temperature control architecture as depicted in FIG. 2, only the inner and outer zone temperature setpoints 231 and 233 are provided for each step, N, defined in the recipe file 260 (with the CHX setpoint 245 typically provided at the recipe level to be held constant for all steps of the recipe). In such a configuration, the PID values 217 and 222 remain static for every recipe step 270 in every recipe file 260. It has been found that such a static PID control architecture is particularly disadvantageous where either or both of the temperature setpoints (231 and 233) vary significantly between steps within a recipe. A static set of PID values, determined under a particular set of conditions may provide over-control or under-control at other conditions. It has been determined that a substantial reduction in the response times depicted in FIG. 1 can be achieved with an adaptive control system whereby the PID values 217 and 222 may be varied between recipe steps to enable a gain scheduling of the linear process controllers. Such an adaptive control architecture is depicted in FIG. 3.

Figure 3:
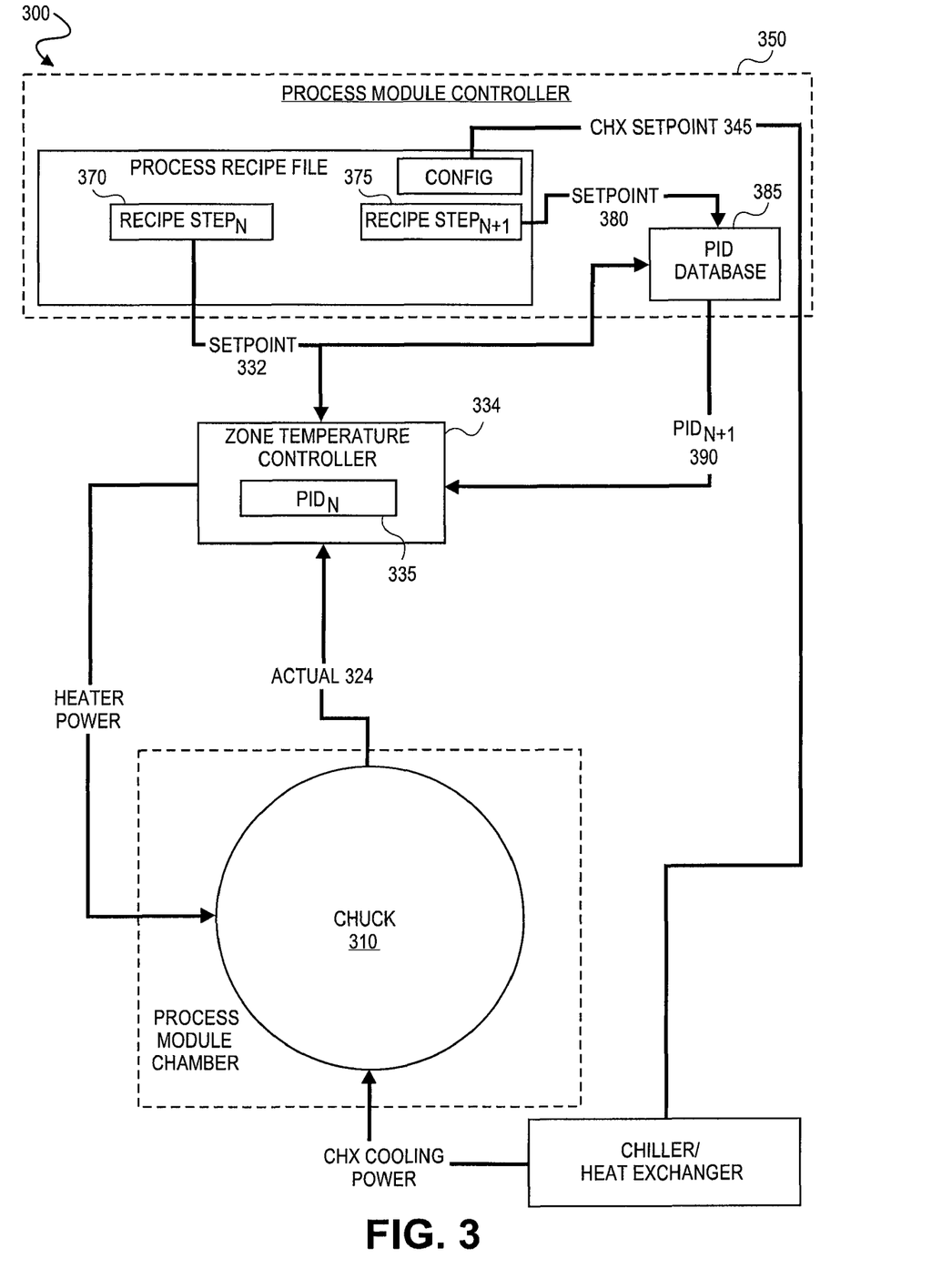
FIG. 3 illustrates a schematic of a semiconductor apparatus employing a PID database and having a chuck temperature controller with PID gain scheduling across recipe steps to achieve adaptive control, in accordance with the present invention.

For clarity, only one of the zone temperature controllers from FIG. 2 is depicted in system 300 of FIG. 3. Nonetheless, particular implementations of the control architecture described herein include a plurality of independently controllable zones, each operable in substantially the same manner depicted in FIG. 3. Thus, both a single and a plurality of temperature controllers may be operated with a control architecture including a PID gain value that is dependent on the recipe step. Hence, for the current recipe step 370, a temperature setpoint 332 is provided to the zone temperature controller 334. The zone temperature controller then employs the $PID_n$ value 335 ($K_{p,n}$, $K_{i,n}$, $K_{d,n}$) in the PID algorithm to control the actual process temperature 324 of the chuck 310. In the subsequent step 375, the zone temperature controller 334 is provided with the $PID_{n+1}$ value 390 ($K_{p,n+1}$, $K_{i,n+1}$, $K_{d,n+1}$) from the process module controller 350. In this embodiment, the $PID_n$ and $PID_{n+1}$ values, 335 and 390 are determined from a PID database 385 comprising predetermined PID values. The zone temperature controller 334 then employs the $PID_{n+1}$ values to control the actual process temperature 324 to the temperature setpoint 380. In a particular implementation, the process module controller 350 communicates the dynamic PID value to the zone temperature controller 334 concurrently with the process temperature setpoint of the corresponding step. In this manner, the zone temperature controller 334 may implement a PID control algorithm specifically tuned to the particular set of starting conditions and setpoint for each of a plurality of process steps within a process recipe. This is particularly advantageous when the range of process temperatures is wide where a static PID value would otherwise under-control in one range and over-control in the another range (thereby leading to overshoot, oscillation and/or slow ramp rates as depicted in FIG. 1).

In a particular embodiment, at least one gain ($K_p$, $K_i$, $K_d$) of the dynamic PID value is determined or scheduled as a function of both the process temperature setpoint of the current step, N, and of the subsequent step, N+1. In a specific embodiment, at least one gain of the dynamic PID value is determined as a function of the process temperature setpoint of the current step, N, and as a function of a temperature delta ($\Delta T$) between the process temperature setpoint of the current step, N, and the process temperature setpoint of the subsequent step, N+1. In one such embodiment, at least one gain of the dynamic PID value is dependent on whether the temperature delta is less than a threshold value or at least the threshold value. In one implementation, the temperature delta threshold is approximately 10° C. In another implementation the temperature delta threshold is between 10° C. and 15° C. and in yet another implementation the temperature delta threshold is between 15° C. and 50° C.

The dynamic PID value may be further determined as a function of a chiller and/or heat exchanger setpoint, such as CHX setpoint 345 (i.e. chiller and/or heat exchanger setpoint is a scheduling variable) in gain scheduling algorithm. For example, the process module controller 350 may access the PID database 385 and determine the $PID_{N+1}$ value 390 based on the following scheduling variables: 1) the temperature setpoint 332 of the current recipe step 370; 2) the temperature delta between the temperature setpoint 332 and the temperature setpoint 380 of the subsequent step 375; and 3) the CHX setpoint 345. The process module controller 350 may similarly determine the dynamic PID value for all of the process steps in a recipe. The PID values may then be stored in a memory and subsequently communicated to the zone temperature controller 334 upon the execution of each particular step on the basis of the scheduling variables associated with that step.

The PID database 385 may be of any conventional database file structure and include any number of files. In a particular embodiment, the PID database 385 is a look up table (LUT) 485 comprising empirically identified values in the exemplary structure depicted in FIG. 4. The LUT 485 includes a plurality of CHX setpoints 445 as scheduling variables paired with a plurality of chuck process temperature setpoints 432 for an initial state ($Step_N$). A set of PID values is then defined for each of the plurality of initial condition pairs depending on the temperature delta 486 that will occur when the recipe progresses from $Step_N$ to the $Step_{N+1}$. In this exemplary implementation, one set of gains is provided as a PID value when the temperature delta is less than 10° C. and a second set of gains is provided as a PID value when the temperature delta is greater than or equal to 10° C. As shown in the LUT 485, one implementation includes an adaptive control architecture wherein only the proportional gain value, $K_p$, varies as a dependent of the scheduling variables: 1) CHX setpoint 445; 2) chuck process temperature setpoint 432 and 3) temperature delta 486 between steps. In such an embodiment, an increase in the proportional gain ($1/K_p$ depicted in LUT 485 is decreased) for larger temperature deltas (meeting the threshold) advantageously reduces controller response for large increments in chuck process temperature.

Figure 4:
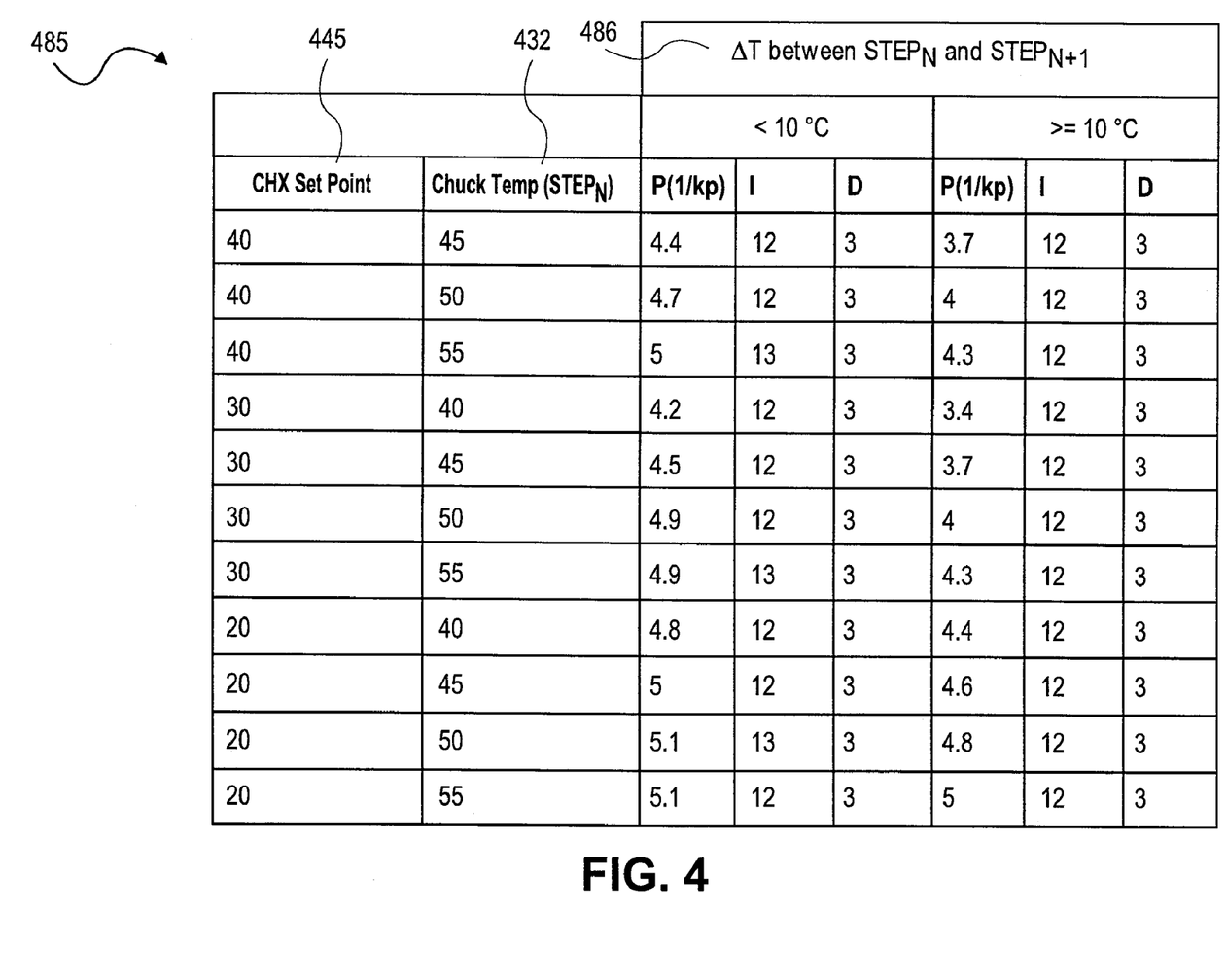
FIG. 4 illustrates a number of fields in a PID database, in accordance with the present invention.

As further shown in the LUT 485, the proportional gain, $K_p$, is decreased as the CHX setpoint 445 is reduced ($1/K_p$ depicted in LUT 485 is increased). Similarly, the proportional gain, $K_p$, is increased ($1/K_p$ depicted in LUT 485 is decreased) as the chuck process temperature 432 at the initial state is increased. Thus, as illustrated by the exemplary LUT 485, the control architecture disclosed herein causes the zone temperature controller 334 (FIG. 3) to employ a higher proportional gain, $K_p$, when the temperature delta between consecutive steps is larger (e.g. exceeding a delta threshold), a lower proportional gain, $K_p$, with higher initial process temperature setpoints, and a lower proportional gain, $K_p$, with a lower CHX setpoint. In one such embodiment, as depicted in FIG. 4, the integral and derivative gains, $K_i$ and $K_d$, are held substantially constant over the range of $K_p$.

For an embodiment employing a dual zone chuck, the PID database 385 includes two files, one for inner chuck temperature zone and one for the outer chuck temperature zone. In still other embodiments, the PID database 385 (FIG. 3) provides a PID value dependent on additional scheduling variables. For example, in an embodiment employing a plurality of independently controlled zones, such as that depicted in FIG. 2, the PID value of each zone is further provided for each recipe step as a function of the temperature setpoints of the other zones. Because there may be thermal coupling between the first and second zones, such an embodiment may improve control response time across steps having varying differences in process temperature between zones. In still another embodiment, the plasma input power is an additional scheduling variable.

In an alternative embodiment, the PID values for the steps in a particular recipe are determined with an algorithm based on a model of the non-linearity present in a process parameter, such as the chuck temperature, over the range of setpoints. The model may be numerically generated with a curve fitting routine. In such an embodiment, the system model, once constructed, is then evaluated based on the particular scheduling variables described elsewhere herein at each step of the process recipe to schedule the gain to tune the PID loop for each recipe step.

Figure 5:
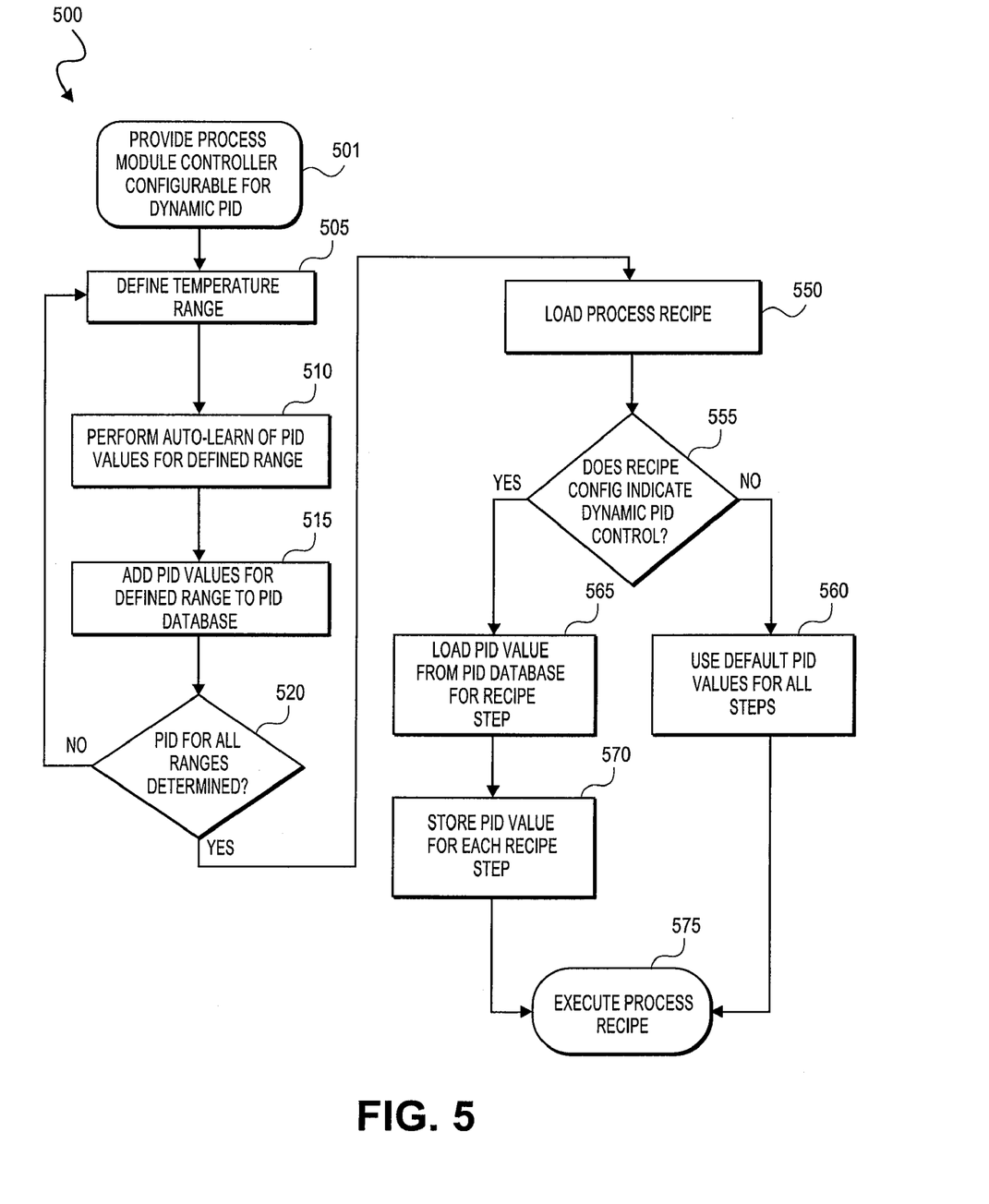
FIG. 5 illustrates a method of constructing a PID database and loading PID values from the database and execution of a process recipe, in accordance with the present invention.

In one embodiment, a plurality of PID values for various input conditions over a range of temperatures is predetermined; a PID database populated with the predetermined values and then dynamically provided to the PID controller at each step of the process recipe to implement adaptive control with linear PID controllers. FIG. 5 depicts a method 500 illustrating one exemplary implementation. The method 500 begins at operation 501 with a process module controller configured for determination and communication of dynamic PID values. At operation 515, the process module controller then populates a PID database with a plurality of PID values corresponding to a temperature delta scheduling variable, such as "less than 10° C." In one embodiment, to construct a PID database, at operation 510, a PID controller, such as the zone temperature controller 334 of FIG. 3, executes an auto-learn routine for each of a number of starting conditions for the particular temperature range defined in operation 505. In one particular embodiment, both a chiller and/or heat exchanger setpoint and an initial chuck temperature is varied for the temperature range defined at operation 505 and a PID controller auto-learn routine is performed to deduce a plurality of PID values. In a further embodiment, extreme temperature setpoint combinations are tested and the results interpolated to provide PID values for combinations there between. In a further embodiment, further manual fine-tuning of the PID setting for best performance may be empirically performed at this time (not shown in FIG. 5). The PID values determined at operation 510 for the temperature range defined in operation 505 are then added to a PID database at operation 515, such as PID database 385 of FIG. 3. At operation 520, it is determined if additional temperature ranges are to be defined, such as "greater than or equal to 10° C." If so, the process repeats operations 505 through 520. If no additional ranges are to be defined, then predetermination of the PID values is substantially complete.

Proceeding with method 500, at operation 550, the process module controller is caused to load a process recipe file into memory. At operation 555, the process module controller determines if the recipe file contains an indication dynamic PID control is to be employed. In a particular implementation, a flag set in the configuration data of the recipe file indicates whether dynamic PID control is to be employed during execution of the recipe file. If the flag indicates no step-by-step PID control is to be employed, then the PID controller(s) uses default PID values for all steps of the process recipe 560 when subsequently executing the process recipe at operation 575.

If instead, the flag evaluated at operation 555 indicates dynamic PID control is to be employed, the system then loads the PID values for one or more recipe steps from a PID database, such as the LUT 485. At operation 570, the PID database is loaded and stored in a memory. At operation 575, the process recipe is then executed and the PID database is accessed at least upon initiating a stability step to determine the PID value for that step from the PID database based on the input conditions at that step, such as current chuck temperature, chiller and/or heat exchanger setpoint and temperature delta.

It should be appreciated that operations 501-520 may be performed sometime prior to the operations 550-575. In one embodiment, operations 501-520 are performed prior to installation of a process module into a manufacturing line. In another implementation, operations 501-520 are performed after installation of the module and repeated upon any substantial change in system configuration (e.g. new chuck, new chiller and/or heat exchanger, etc) to enable the PID value stored in the PID database to be customized across the tool install base. In still another implementation the operation 501-520 are performed automatically with an auto-learn routine executed by a process module controller. During such an auto-learn routine, operations 501-520 are executed at least once across a particular temperature delta or range, preferably operation 501-520 are automatically executed to determine a plurality of PID values for at least two different temperature deltas (eg. <10° C. and >=10° C.).

Figure 6A:
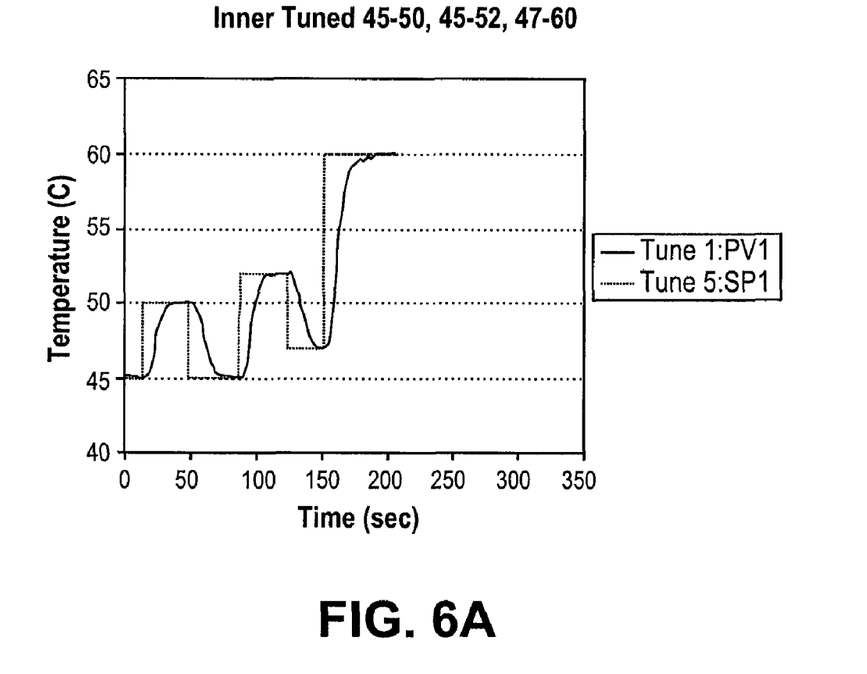
FIG. 6A illustrates a graph depicting the response time of a chuck temperature controller employing recipe PID gain scheduling over a number of temperature setpoints.
Figure 6B:
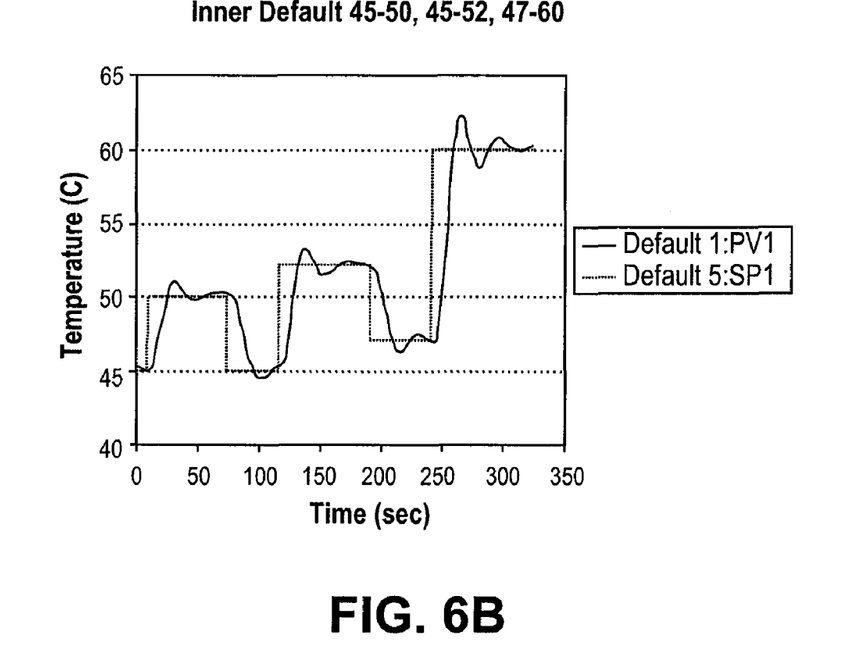
FIG. 6B illustrates a graph depicting the response time of a conventional chuck temperature controller employing static PID values over the same temperature setpoints depicted in FIG. 6A.

FIGS. 6A and 6B provide a direct comparison of the control response from a control architecture enabling PID values to be dynamically changed between steps of a recipe and the conventional method employing a fixed PID value for all steps of a recipe. FIG. 6A depicts a control response, PV1, for dynamic, "tuned" PID values as the setpoint, SP1, is ramped up from 45° C. to 50° C. at step 1, then again from 45° C. up to 52° C. at step 2 and finally from 47° C. to 60° C. at step 3 (neglecting ramp downs between steps). Referring to the LUT 485 of FIG. 4, when these exemplary recipe steps are ran on a system configured for dynamic PID values, such the system depicted in FIG. 3, with an CHX setpoint of 30° C., the proportional gain, P, in the set of PID values employed by the zone temperature controller 334 is 4.5 at step 1, 4.9 at step 2, and finally 3.7 at step 3. In this particular embodiment, the integral and derivative gains remain constant for each ramp up step as provided in the LUT 485. As further shown, the ramp up of step 1 requires at total time of 15 seconds, the ramp up of step 2 is performed in 16 seconds, and the ramp up of step 3 is performed in 30 seconds for total ramp up time of approximately 61 seconds.

FIG. 6B illustrates control response, PV1, for a static, "default" PID value as the setpoint, SP1, is changed in the same sequence as that in FIG. 6A. The ramp up time of each step is significantly longer than that of FIG. 6A. Specifically, the first ramp up step requires 26 seconds, the second ramp up requires 39 seconds and the third ramp up requires 58 seconds. Also evident in the control response of FIG. 6B is the increasing instability with steps having a large temperature setpoint delta, such as step 3, which is a result of having a fixed proportional gain across all recipe steps.

Portions of the present invention may be provided as a computer program product, which may include a computer-readable medium having stored thereon instructions, which when executed by a computer (or other electronic devices), cause a process recipe to be loaded into a memory; cause a determination of a first chuck temperature setpoint of a first recipe step; cause a determination of a second chuck temperature setpoint of a second recipe step; cause a determination of a first set of PID values as a function of at least the first chuck temperature setpoint and a temperature delta between the first and second chuck temperature setpoint; and cause the second process recipe step to be executed while controlling the chuck temperature with a PID controller employing the determined first set of PID values. In other embodiments, a computer-readable medium has stored thereon instructions, which when executed by a computer (or other electronic devices), cause a determination of a third chuck temperature setpoint of a third step in the process recipe; cause a determination of a second set of PID values, different than the first set of PID values; and cause the third process recipe step to be executed while controlling the chuck temperature with a PID controller employing the determined second set of PID values. In a further embodiment, a computer-readable medium has stored thereon instructions, which when executed by a computer (or other electronic device), cause a first set of PID values to be accessed from a PID look up table stored in memory, wherein the PID look up table includes a set of PID values for each of a plurality of chuck and chiller and/or heat exchanger setpoint pairs for all temperature deltas less than a threshold and a set of PID values for each of a plurality of chuck and chiller and/or heat exchanger setpoint pairs for all temperature deltas greater than the threshold.

The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known types of computer-readable medium suitable for storing electronic instructions. Moreover, the present invention may also be downloaded as a computer program product, wherein the program may be transferred from a remote computer to a requesting computer over a wire.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method for adaptively controlling a process temperature during a plasma etch process, comprising:
    loading into a memory a first setpoint for a process temperature in a first recipe step and a second setpoint for the process temperature in a second recipe step;
    accessing a look up table to determine a first set of proportional-integral-derivative (PID) values for a PID controller to control the process temperature at the first setpoint;
    accessing the look up table to determine a second set of PID values for the PID controller to control the process temperature at the second setpoint, wherein at least one value of the PID values in the second set is different than those of the first set and wherein at least one of the first and second set of PID values is determined by accessing the look up table based on the process temperature setpoint of a recipe step, a heat exchanger or chiller setpoint temperature, and a temperature setpoint delta between setpoints of the process temperature in two consecutive recipe steps.

2. The method of claim 1, wherein the second set of PID values is determined from the look up table based on the second setpoint and based on a temperature setpoint delta between the first setpoint and the second setpoint.

3. The method of claim 2, wherein only a proportional gain value of the second set of PID values is different than those of the first set of PID values, the proportional gain value decreasing as a function of the first setpoint but increasing as a function of the temperature setpoint delta between the consecutive recipe steps.

4. The method of claim 2, wherein at least one of the first and the second set of PID values is dependent on whether the setpoint temperature delta is greater than a temperature delta threshold.

5. The method of claim 4, wherein the temperature setpoint delta threshold is between about 10° C. and about 15° C.

6. The method of claim 2, wherein controlling the chuck temperature at the second setpoint further comprises:
    cooling the chuck with a coolant, the coolant provided at a temperature controlled by at least one of a chiller or heat exchanger; and
    heating the chuck with a first heating element to the second setpoint, higher than the coolant temperature, wherein the power input to the first heating element is controlled by the PID controller using the second set of PID values.

7. The method of claim 6, wherein only the proportional gain value of the second set of PID values is different than those of the first set of PID values, the proportional gain value decreasing as a function of the coolant temperature decreasing.

8. The method of claim 1, wherein at least one of the first and the second set of PID values comprises a set of values predetermined by a method comprising:
    defining a set of first chuck temperature setpoints;
    defining a set of second chuck setpoints;
    defining a set of coolant temperature setpoints;
    executing an auto-learn function of the PID controller at least once for each of a plurality of starting conditions comprising the defined first chuck temperature setpoints, second chuck setpoints and coolant temperature setpoints.

9. The method of claim 6, wherein the chuck further includes a second heating element controlled by a second PID controller using a third set of PID values to provide a second independently controlled temperature zone within the chuck, and wherein the third set of PID values is also a function of at least a first temperature setpoint for the second zone in the first recipe step and a temperature setpoint delta between temperature setpoints for the second zone in the first and second recipe steps.

10. The method of claim 9, wherein the second set of PID values is further determined as a function of a temperature setpoint of the second temperature zone in at least one of the first or second recipe step.

11. A computer readable media with instructions stored thereon, which when executed by a processing system, cause the system to perform a method comprising:
    loading a process recipe into a memory;
    determining from the process recipe a first chuck temperature setpoint of a first recipe step;
    determining from the process recipe a second chuck temperature setpoint of a second recipe step;
    accessing a look up table to determine a set of PID values associated with at least the first chuck temperature setpoint, a setpoint of at least one of a chiller or heat exchanger, and a temperature setpoint delta between the first and second chuck temperature setpoints; and
    executing the second recipe step of the process recipe while controlling a chuck temperature with a PID controller employing the determined set of PID values.

12. The media of claim 11, wherein the instructions further provide for:
    determining from the process recipe a chuck temperature setpoint of a third recipe step;
    determining a subsequent set of PID values; and
    executing the third recipe step while controlling the chuck temperature with a PID controller employing the determined subsequent set of PID values.

13. The media of claim 11, wherein the media further includes instructions for determining the first set of PID values is from the look up table comprising:
    a set of PID values for each of a plurality of chuck and heat exchanger setpoint pairs for all temperature setpoint deltas less than a threshold; and
    a set of PID values for each of a plurality of chuck and heat exchanger setpoint pairs for all temperature setpoint deltas greater than the threshold.

14. A plasma etch apparatus, comprising:
    a process module including a chuck;
    a process module recipe file defining a sequence of recipe steps to occur in the process module, wherein a chuck temperature setpoint of a first zone of the chuck is different between a first and a second recipe step;
    at least one of a chiller or heat exchanger to provide coolant to the chuck, the chiller or heat exchanger communicatively coupled to the process module controller;
    a first heater to heat the first zone of the chuck above the temperature of the coolant to the chuck temperature setpoint of the first and second recipe steps; and a process module controller to determine a first set of PID values for controlling the first chuck zone temperature during the first recipe step and a second set of PID values for controlling the first chuck zone temperature during the second recipe step, wherein the process module controller is to determine at least one of the first and second set of PID values by accessing a look up table based on a chuck temperature setpoint, the heat exchanger or chiller setpoint temperature, and a temperature setpoint delta between chuck temperature setpoints of two consecutive recipe steps.

15. The apparatus of claim 14, wherein the PID values in the look up table are a function of the chuck temperature setpoint in the first recipe step and a function of a delta between the temperature setpoint of two consecutive recipe steps.

16. The apparatus of claim 14, further comprising:

a second heater to heat a second zone of the chuck, independent of the first zone, above the temperature of the coolant, to a temperature setpoint of a second zone of the chuck defined in the recipe file for the first and second recipe steps, wherein the look up table is to be accessed by the process module controller to determine a third set of PID values for controlling the second chuck zone temperature during the first recipe step and to determine a fourth set of PID values for controlling the second chuck zone temperature during the second recipe step.

17. A method for adaptively controlling a process parameter during an etch process, comprising:

employing a first set of proportional-integral-derivative (PID) values in a PID controller to control the process parameter at a first setpoint in a first step of a process recipe; and employing a second set of PID values in the PID controller to control the process parameter at a second setpoint, different than the first setpoint, in a second step of the process recipe, wherein at least one of the PID values in the second set is different than those of the first set, and wherein the second set of PID values comprises a set of values predetermined by a method comprising:

defining a set of first chuck temperature setpoints;

defining a set of second chuck setpoints;

defining a set of coolant temperature setpoints; and executing an auto-learn function of the PID controller at least once for a plurality of the defined first chuck temperature setpoints, second chuck setpoints and coolant temperature setpoints.

* * * * *